(12) United States Patent
Bromberger

(10) Patent No.: US 7,320,922 B2
(45) Date of Patent: Jan. 22, 2008

(54) INTEGRATED CIRCUIT AND METHOD FOR MANUFACTURING AN INTEGRATED CIRCUIT ON A SEMICONDUCTOR CHIP

(75) Inventor: Christoph Bromberger, Heilbronn (DE)

(73) Assignee: Atmel Germany GmbH, Heilbronn (DE)

( * ) Notice: Subject to any disclaimer, the term of this patent is extended or adjusted under 35 U.S.C. 154(b) by 27 days.

(21) Appl. No.: 11/273,083

(22) Filed: Nov. 15, 2005

(65) Prior Publication Data

US 2006/0105535 A1 May 18, 2006

(30) Foreign Application Priority Data

Nov. 16, 2004 (DE) .................. 10 2004 055 213

(51) Int. Cl.
*H01L 21/331* (2006.01)
(52) U.S. Cl. ............... 438/338; 438/334; 438/336; 438/343; 438/357
(58) Field of Classification Search ........... 438/334, 438/336, 343, 357
See application file for complete search history.

(56) References Cited

U.S. PATENT DOCUMENTS

| | | | |
|---|---|---|---|
| 4,157,268 A | 6/1979 | Bergeron et al. | |
| 4,323,417 A | 4/1982 | Lam | |
| 4,704,785 A | 11/1987 | Curran | |
| 4,882,294 A | 11/1989 | Christenson | |
| 5,358,908 A | 10/1994 | Reinberg et al. | |
| 6,734,470 B1 * | 5/2004 | Schulman et al. | 257/104 |
| 2001/0008284 A1 | 7/2001 | Huang | |
| 2001/0008298 A1 | 7/2001 | Sato | |
| 2001/0045619 A1 | 11/2001 | Dekker et al. | |
| 2002/0173086 A1 | 11/2002 | Dietrich et al. | |
| 2003/0052721 A1 * | 3/2003 | Chaudhry et al. | 327/242 |
| 2003/0183903 A1 | 10/2003 | Ikeda | |
| 2004/0169257 A1 | 9/2004 | Romas et al. | |

FOREIGN PATENT DOCUMENTS

| | | |
|---|---|---|
| DE | 198 26 546 | 8/1999 |
| DE | 198 45 790 | 3/2000 |
| DE | 101 24 032 A1 | 11/2002 |

* cited by examiner

*Primary Examiner*—Matthew Smith
*Assistant Examiner*—Ankush K Singal
(74) *Attorney, Agent, or Firm*—Geissler, Olds & Lowe, PLLC

(57) ABSTRACT

An integrated circuit on a semiconductor chip is provided with a first bipolar transistor and a second bipolar transistor. The first bipolar transistor has a first collector region of a first conductivity type, grown by at least one epitaxial layer, and the second bipolar transistor has a second collector region of this first conductivity type grown by this epitaxial layer. The first collector region also has a first collector drift zone, and the second collector region has a second collector drift zone. Whereby, the first collector drift zone is shortened as compared to the second collector drift zone by partial etching of the epitaxial layer.

17 Claims, 2 Drawing Sheets

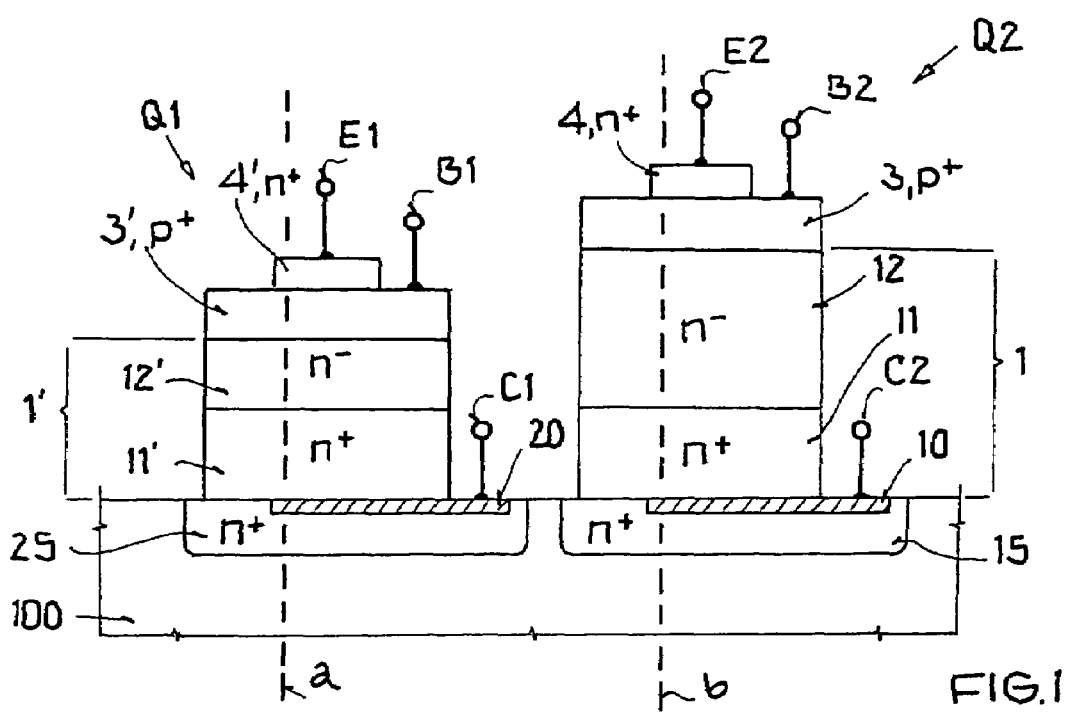
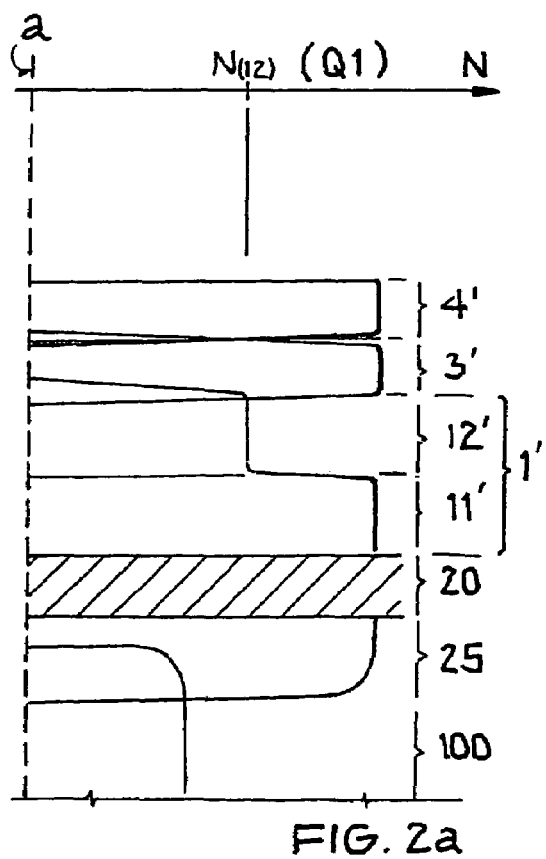
FIG. 2a
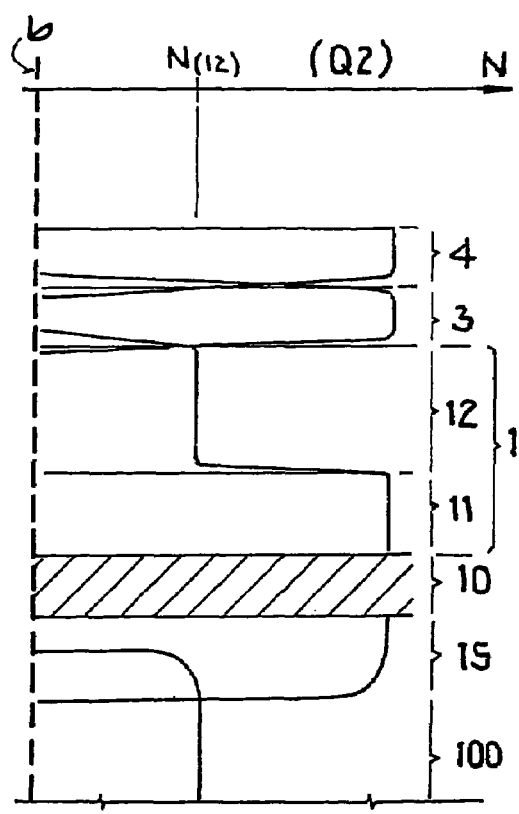
FIG. 2b

US 7,320,922 B2

INTEGRATED CIRCUIT AND METHOD FOR MANUFACTURING AN INTEGRATED CIRCUIT ON A SEMICONDUCTOR CHIP

This nonprovisional application claims priority under 35 U.S.C. § 119(a) on Patent Application No. DE 10 2004 055 213.4 filed in Germany on Nov. 16, 2004, which is herein incorporated by reference.

BACKGROUND OF THE INVENTION

1. Field of the Invention

The present invention relates to an integrated circuit and a method for manufacturing an integrated circuit on a semiconductor chip.

2. Description of the Background Art

In semiconductor technologies there are provided vertical bipolar transistors with various dielectric strengths and frequency capabilities. In this regard, dielectric strength generally increases with decreasing collector doping. Relatively low collector doping likewise results in a relatively low cutoff frequency.

A method of selective collector implantation is known, especially for the high frequency range. In this context, a first and a second collector region are created from a uniform collector epitaxy; a collector of a first bipolar transistor with high dielectric strength and low frequency capability is produced from the first collector region, and a collector of a second bipolar transistor with lower dielectric strength and better frequency capability is produced from the second collector region. To this end, the second collector region is provided with an additional collector implantation (SIC—selectively implanted collector) in a limited area. As a result of this selective collector implantation, the dopant concentration in the second collector region is raised above the dopant concentration in the first collector region.

In semiconductors, pn junctions exist, in particular, as "long" or "short" diodes. In a "long" p-n-n$^+$ diode, the space charge zone ends on the n-side in the n$^-$ region for reverse voltages such as are present at the pn junction under normal operating conditions, whereas in "short" diodes, the space charge zone reaches through into the n$^+$ region. As a result of the reach-through, the blocking capability of "short" diodes is reduced as compared to the blocking capability of a "long" diode with the same dopant level. For a bipolar transistor with a given collector-base breakdown voltage, a certain extension of the collector drift zone is thus necessary, and consequently requires a certain thickness of the collector epitaxy.

Conversely, the collector resistance is an important criterion for the quality of the bipolar transistor, especially in the high frequency range. One part of the collector resistance is the resistance of a portion of the collector drift zone that may not be depleted under normal operating conditions. In general, the extension of the collector space charge zone is reduced under the desired operating conditions by a sufficiently high selective collector implantation. Since it is also necessary in setting the thickness of the collector epitaxy to consider the needs of the higher blocking transistor, the second collector region frequently is not fully depleted in operation of the second bipolar transistor. This disadvantageously increases the collector resistance of the second bipolar transistor. For example, a 120 nm non-depleted collector drift zone with a typical cross-section of 20×0.6 µm$^2$ still leads to an additional collector resistance of 8 ohms, even at the high collector doping of 1e17 cm$^{-3}$; in many cases this constitutes the major portion of the overall collector resistance.

In the high frequency range, the transistors are preferably operated at high current densities to reduce the charge transfer times of the diffusion capacitance layers. In this connection, the space charge density resulting from the ion cores (p-charged, in the case of an npn transistor) in the depleted part of the collector drift zone is at least partially compensated by the space charge density of the electrons moving at terminal velocity through the space charge zone. The collector edge of the space charge zone thus migrates toward the subcollector. At the operating point optimal for $f_T$, essentially only the subcollector edge contributes to the collector resistance, while the collector drift zone does not.

In producing the aforementioned collector drift zones according to the conventional art, a silicon collector epitaxy approximately 190 nm thick and doped at 1e17 cm$^{-3}$ is grown on a highly n-doped monocrystalline silicon layer as a subcollector, wherein a thickness margin of 20 nm serves to compensate for the diffusion of dopant out of the highly n-doped silicon layer. This epitaxial layer "as grown" constitutes the low-doped collector drift zone.

SUMMARY OF THE INVENTION

It is therefore an object of the present invention to provide a method with which different transistors with different collector drift zones can be implemented on a single semiconductor chip, wherein the highest possible vertical concentration gradient is to be achieved in the collector region.

Accordingly, in a method for producing an integrated circuit on a semiconductor chip, a first bipolar transistor with a first collector region of a first conductivity type and a second bipolar transistor with a second collector region of this first conductivity type are produced. The first conductivity type here is, for example, a n-conductivity type, such as can be produced by phosphorus doping, for example.

The first collector region and the second collector region can be grown by at least one collector epitaxy. The collector epitaxy in this context can be composed of one or more epitaxy steps. Moreover, the introduction of a dopant profile during the epitaxy is also possible.

An embodiment of the invention provides for the introduction of an etch stop in the first collector region. In contrast, the second collector region of the second transistor is not etched, so no etch stop is required here, or in the event that an etch stop is present it has no effect on account of the lack of etching.

This first collector region can be shortened by an etching. This has the effect that the two transistors have different high frequency characteristics. In this regard, the first transistor preferably has a higher unity gain crossover frequency $f_T$ and a lower breakdown voltage than the second transistor. In this inventive method, a sharp, epitaxially produced n$^-$-n$^+$ junction preferably is preserved.

An embodiment of the invention provides that the etch stop can be selectively introduced into the first collector region by a doping profile. For example, for silicon an etchant can be used that contains a mixture of one part hydrofluoric acid, HF, three parts nitric acid, HNO$_3$, and eight parts formic acid, CH$_3$COOH. The aforementioned etchant mixture etches silicon at an etching rate of 0.01 µm per minute when the resistivity of the silicon is less than approximately 0.01 ohm-cm on account of its doping, but etches at an etch rate of 1 µm per minute at a resistivity of greater than 0.1 ohm-cm. Accordingly, etching comes essentially to a standstill at a dopant concentration of approximately 5e17 cm$^{-3}$.

According to another embodiment of the invention, after the formation of a thick, low-doped collector drift zone, a region between 100 nm and 170 nm deep in the silicon can be brought to a dopant concentration of approximately 5e17 cm$^{-3}$ by a medium-energy implantation, while the silicon material is doped by two low-energy implantations to a depth of approximately 70 nm to a sufficiently high degree that it can subsequently be removed with the aid of the aforementioned etchant mixture.

Accordingly, a further embodiment provides that a mask is applied and dopants are implanted for selective introduction of the doping profile. In this regard, the mask covers at least the collector region of the second transistor.

In yet a further embodiment of the invention, a doping profile is introduced into the first collector region during the manufacturing process in such a manner that a first semiconductor region in the first collector region has a first dopant concentration and a second semiconductor region of the first collector region located above the first semiconductor region has a second dopant concentration, wherein the second dopant concentration in the second semiconductor region is higher than the first dopant concentration in the first semiconductor region.

The second semiconductor region can be etched essentially down to the first semiconductor region by an etchant acting selectively on the highly doped second semiconductor region, wherein the low, first dopant concentration of the first semiconductor region functions as etch stop.

Two different, but also combinable, embodiments provide for dopants to be implanted in the first semiconductor region before and/or after the etching of the second semiconductor region.

A further embodiment of the invention provides that a silicon-germanium layer is introduced during collector epitaxy. The first collector region can be etched to the silicon-germanium layer in that the silicon-germanium layer functions as an etch stop for the etchant used.

In another embodiment of the invention, provision is further made that once the etching process has reached the silicon-germanium layer, this silicon-germanium layer is removed in the first collector region. In addition, dopants can be introduced into the remaining epitaxial layer before and/or after the removal.

An advantageous embodiment of the invention provides that during collector epitaxy, a dopant concentration curve with a concentration gradient greater than 1e22 cm$^{-4}$ is produced in the first collector region and in the second collector region.

After selective implantation of dopants in the collector region of the first transistor, provision is advantageously made that a minimum dopant concentration in the first collector region is higher than the minimum dopant concentration in the second collector region.

A further development of the invention provides that the collector epitaxy can be at least partially a lateral solid-phase epitaxy, wherein amorphous silicon is applied on a silicide layer and on a monocrystalline silicon substrate and in an annealing step is crystallized starting from the monocrystalline silicon substrate acting as a crystallization nucleus. In addition, for doping the material of the collector epitaxy, the silicide layer can be provided with an impurity of a type that will subsequently diffuse into the first collector region, where it will act as a dopant of the first conductivity type.

Another embodiment of the invention provides for an integrated circuit on a semiconductor chip. This integrated circuit can have at least one first bipolar transistor and at least one second bipolar transistor. In this context, the first bipolar transistor has a first collector region of a first conductivity type, grown by at least one epitaxial layer, and the second bipolar transistor has a second collector region of this first conductivity type grown by the epitaxial layer.

Moreover, the first collector region can have a first collector drift zone, and the second collector region can have a second collector drift zone. This first collector drift zone can be shortened relative to this second drift zone by partial etching of the epitaxial layer. This has the result that the first collector region has a first collector drift zone, and the second collector region has a second collector drift zone, which are essentially determined by the thickness and the dopant concentration in the collector region.

The first collector region can have a higher minimum dopant concentration than the second collector region.

The first collector region can border directly on a silicon-germanium layer of a first base region—with a second conductivity type—of the first bipolar transistor and/or the second collector can border directly on a silicon-germanium layer of a second base region—with the second conductivity type—of the second bipolar transistor.

According to a further embodiment of the invention, the epitaxial layer borders at least in part on a silicide layer within the first collector region and/or within the second collector region in order to permit a low-resistance connection to this epitaxial layer.

In an advantageous further embodiment of the invention, provision is made for the first collector region and/or the second collector region to have a dopant concentration curve with a concentration gradient greater than 1 e22 cm$^{-4}$.

Another embodiment of the invention provides for an integrated high-frequency cascode circuit with a first bipolar transistor and a second bipolar transistor. In this context, the first bipolar transistor has a first collector region of a first conductivity type grown by at least one epitaxial layer, and the second bipolar transistor has a second collector region of this first conductivity type grown by this epitaxial layer.

The first collector region can have a first collector drift zone, and the second collector region has a second collector drift zone. The first collector drift zone is shortened relative to the second drift zone by partial etching of the epitaxial layer. The second collector region of the second bipolar transistor can be electrically connected to a first emitter region of the first bipolar transistor.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein:

FIG. 1 is a schematic cross-sectional representation through a first bipolar transistor and through a second bipolar transistor according to an embodiment of the present invention;

FIG. 2a is a schematic dopant curve along the section line a;

FIG. 2b is a schematic dopant curve along the section line b;

DETAILED DESCRIPTION

Figure 3:
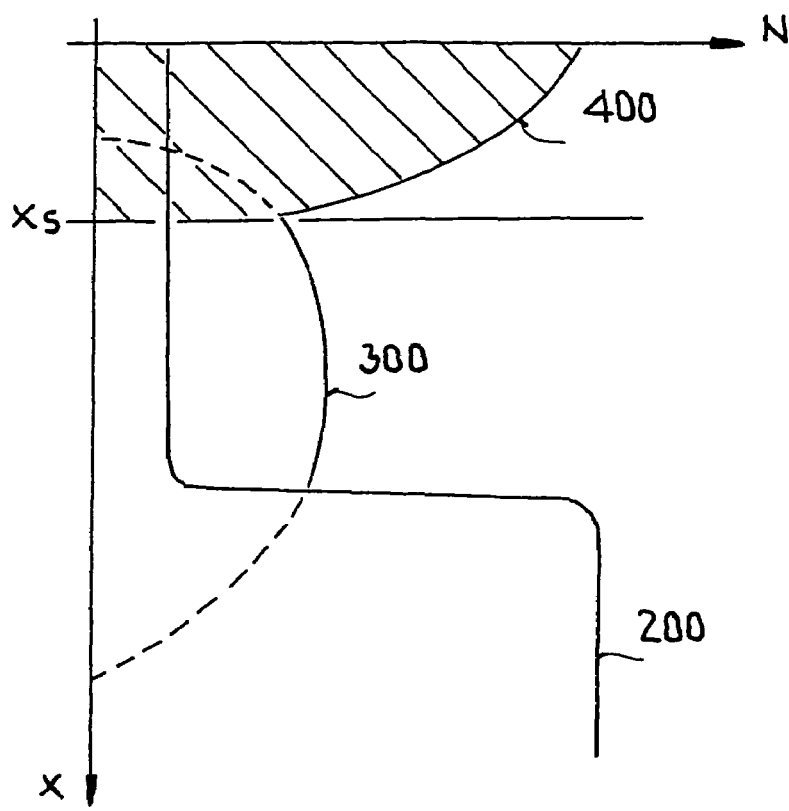
FIG. 3 is a schematic dopant curve during a production process step.

FIG. 1 shows two bipolar transistors Q1 and Q2. Both transistors Q1 and Q2 are described below as npn bipolar transistors, a great number of which may be present in an integrated circuit. However, the invention is also equally applicable to pnp bipolar transistors by simply swapping the conductivity types. The semiconductor regions 3' and 4' of the first left-hand bipolar transistor Q1 in FIG. 1 are identical to the corresponding semiconductor regions 3, 4 of the second, right-hand bipolar transistor Q2 in this example embodiment.

The first transistor Q1 is created on a substrate 100 by an epitaxial process. For this purpose, to obtain a low-resistance contact to the collector C1, a highly p-doped well 25 (8e19 cm$^{-3}$) is introduced into the p-doped substrate and a suicide layer 20 is formed. On top of the suicide layer 20, a monocrystalline collector epitaxial layer 1'is grown, for example through solid-phase epitaxy, with a thickness of, e.g., 70 nm. In addition, a collector epitaxial layer of a second collector region 1 of the second transistor Q2 is grown in the same epitaxy. This second collector region 1 of the second transistor Q2 is also grown in a monocrystalline manner on a suicide layer 10, wherein the silicide layer 10 in turn is applied on a highly n-doped well 15 (8e19 cm$^{-3}$) that is introduced into the substrate 100 to connect to the collector C2 of the second transistor Q2.

In addition, the silicide layers 10, 20 serve as solid dopant sources which are used in the further course of the manufacturing process to produce by diffusion a dopant concentration of preferably more than 1e20 cm$^{-3}$ in edge regions of the highly doped wells 15, 25 and of the collector epitaxial layers 1, 1' adjacent to the silicide layers 10, 20.

The collector region 1' of the first transistor Q1 is different from the collector region 1 of the second transistor Q2 in this regard. The collector region 1' of the first transistor Q1 has a first, highly doped semiconductor region 11' and a second, low-doped semiconductor region 12'. The first semiconductor region 11 of the second transistor Q2 likewise has a high dopant concentration N(11) and the same thickness as the first semiconductor region 11' of the first transistor Q1. In contrast, the second semiconductor region 12 of the second transistor Q2 is less highly doped and has a greater thickness than the second semiconductor region 12' of the first transistor Q1. For example, the dopant concentration N(12) in the second semiconductor region 12 of the second transistor Q2 can be 2e16 cm$^{-3}$ and the thickness of the second semiconductor region 12 of the second transistor Q2 can be 200 nm. The dopant concentration N(12') in the second semiconductor region 12' of the first transistor Q1, however, is in the range of 5e17 cm$^{-3}$ and its thickness in this example embodiment is 50 nm.

These second semiconductor regions 12', 12 in the transistors Q1 and Q2 border on the semiconductor region 3', 3 (with a maximum dopant concentration of, for example, 2e19 cm$^{-3}$) of the base B1 or B2, respectively, of the relevant transistor Q1 or Q2, respectively. In this context, the base semiconductor region 3', 3 preferably has a silicon-germanium layer. The semiconductor regions 4', 4 of the emitters E1 and E2, respectively, of the relevant transistor Q1 or Q2, respectively, border on the base semiconductor region 3', 3 in turn. The dopant concentration in the semiconductor region 4', 4 is approximately 2e18 cm$^{-3}$ in the region bordering the base and is approximately 2e20 cm$^{-3}$ outside the border region, for example. In this example embodiment of the invention, the collector regions 1 and 1' and the emitter layers 4 and 4' are n-doped, while the base layer 3, 3' is p-doped.

The difference between the transistors Q1 and Q2 includes the different collector regions 1 and 1', in particular with the semiconductor regions 12' and 12. This is explained below using the dopant curves N(Q1) and N(Q2) along the section lines a and b. In this regard, the section line a runs through the first bipolar transistor Q1, represented in FIG. 2a, and the section line b runs through the second bipolar transistor Q2, represented in FIG. 2b.

FIG. 2a shows that the collector region 1' of the first transistor Q1 is composed of an epitaxial layer, wherein the first semiconductor region 11' of the epitaxial layer is highly n$^+$-doped in situ and makes possible a quasi-metallic connection to the second semiconductor region 12'. The second semiconductor region 12' of the first transistor Q1 (FIG. 2a), which acts as a collector drift zone, is shortened as compared to the second semiconductor region 12, as is shown in FIG. 2b, and additionally has a higher dopant concentration N(12'). As a result of this measure, the first transistor Q1 is optimized for high frequency applications and has a higher unity gain crossover frequency and a lower breakdown voltage than the transistor Q2.

A step for material removal is provided in the manufacturing process to shorten the second semiconductor region 12'. To this end, as is shown in the attached FIGS. 3 and 4, an etch stop is provided which limits a material etching at the depth x of the epitaxial layer of the first semiconductor region 12' of the first transistor Q1.

FIG. 3 shows a dopant curve for an example embodiment of the invention prior to the etching step. The curve 200 of the doping of the epitaxy has a steep concentration gradient that has been created during the epitaxy. In the low-doped region of the epitaxy doping 200, two additional doping profiles 300 and 400, which have been created by two different implantations, dominate.

The implantation dopant profile 300 of the first implantation is created by a higher implantation energy than the second implantation dopant profile 400, which has a maximum dopant concentration near the surface and only drops at the depth $x_s$ to the dopant concentration of the first implantation dopant profile 300. The high dopant concentration of the second implantation dopant profile 400 permits a selective etching of this highly doped region to the depth $x_s$, where the low dopant concentration at the point $x_s$ acts as an etch stop. In this example embodiment, the selective removal of the highly doped semiconductor region is accomplished by treatment with a mixture of one part hydrofluoric acid, HF, three parts nitric acid, HNO$_3$, and eight parts formic acid, CH$_3$COOH, preferably for as long as the mask for structuring the implantation of the profiles 300, 400 still covers the wafer.

Figure 4:
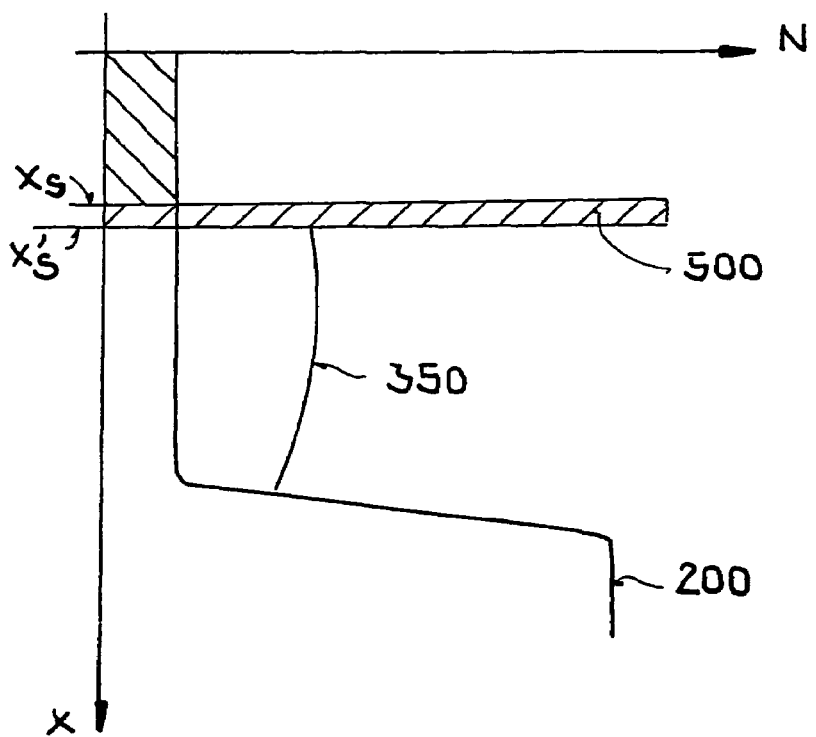
FIG. 4 is a schematic dopant curve with a silicon-germanium layer during a production process step.

FIG. 4 shows another example embodiment of the invention in which a silicon-germanium layer 500 functions as the etch stop. Here, the silicon-germanium layer 500 has been introduced in situ during the epitaxy to produce the epitaxy dopant profile 200. For the etching, an etchant is used that has a relatively low etch rate with respect to the silicon-germanium layer, so the etching ceases at the depth $x_s$. Preferably, the dopant profile 350 is implanted before the etching removal, with the conductivity type being the same as that of the epitaxial layer. Subsequently, the silicon-germanium layer is likewise removed by etching. During these etching steps as shown in FIGS. 3 and 4, the second transistor Q2 is covered by a mask and protected from the etchant. The mask for structuring the implantation of the dopant profile 350 can advantageously serve this purpose, with this mask being removed after the etching step. In this embodiment, the selective removal of the epitaxially applied silicon layer down to the silicon-germanium-etch-stop layer 500 is accomplished by partially covering the wafer with a mask and subsequent treatment with KOH.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method for manufacturing an integrated circuit on a semiconductor chip, the method comprising:
   providing a first bipolar transistor having a first collector region of a first conductivity type; and
   providing a second bipolar transistor with a second collector region having the first conductivity type;
   growing the first collector region and the second collector region by at least one collector epitaxy;
   introducing an etch stop in the first collector region; and
   shortening the first collector region in comparison to the second collector region by a partial etching of the first collector region.

2. A method for manufacturing an integrated circuit on a semiconductor chip, the method comprising:
   providing a first bipolar transistor having a first collector region of a first conductivity type; and
   providing a second bipolar transistor with a second collector region having the first conductivity type;
   growing the first collector region and the second collector region by at least one collector epitaxy;
   introducing an etch stop in the first collector region; and
   shortening the first collector region by an etching,
   wherein an etch stop is selectively introduced into the first collector region by a doping profile.

3. The method according to claim 2, wherein a mask is applied and dopants are implanted for selective introduction of the doping profile.

4. The method according to claim 3, wherein the doping profile is introduced into the first collector region in such a manner that a first semiconductor region in the first collector region has a first dopant concentration and a second semiconductor region of the first collector region located above the first semiconductor region has a second dopant concentration, wherein the second dopant concentration in the second semiconductor region is higher than the first dopant concentration in the first semiconductor region.

5. The method according to claim 4, wherein the second semiconductor region is etched down to the first semiconductor region by an etchant acting selectively on the highly doped second semiconductor region, and wherein the low, first dopant concentration of the first semiconductor region functions as the etch stop.

6. The method according to claim 4, wherein dopants are implanted in the first semiconductor region after the etching of the second semiconductor region.

7. The method according to claim 4, wherein dopants are implanted in the first semiconductor region before etching of the second semiconductor region.

8. A method for manufacturing an integrated circuit on a semiconductor chip, the method comprising:
   providing a first bipolar transistor having a first collector region of a first conductivity type; and
   providing a second bipolar transistor with a second collector region having the first conductivity type;
   growing the first collector region and the second collector region by at least one collector epitaxy;
   introducing an etch stop in the first collector region; and
   shortening the first collector region by an etching,
   wherein a silicon-germanium layer is introduced during collector epitaxy.

9. The method according to claim 8, wherein the first collector region is etched to the silicon-germanium layer, and wherein the silicon-germanium layer functions as an etch stop for the etchant.

10. The method according to claim 9, wherein, once the silicon-germanium layer has been reached, the silicon-germanium layer is removed in the first collector region.

11. A method for manufacturing an integrated circuit on a semiconductor chip, the method comprising:
    providing a first bipolar transistor having a first collector region of a first conductivity type; and
    providing a second bipolar transistor with a second collector region having the first conductivity type;
    growing the first collector region and the second collector region by at least one collector epitaxy;
    introducing an etch stop in the first collector region; and
    shortening the first collector region by an etching,
    wherein, during collector epitaxy, a dopant concentration curve with a concentration gradient greater than $1e22$ $cm^{-4}$ is produced in the first collector region and/or in the second collector region.

12. A method for manufacturing an integrated circuit on a semiconductor chip, the method comprising:
    providing a first bipolar transistor having a first collector region of a first conductivity type; and
    providing a second bipolar transistor with a second collector region having the first conductivity type;
    growing the first collector region and the second collector region by at least one collector epitaxy;
    introducing an etch stop in the first collector region; and
    shortening the first collector region by an etching,
    wherein a minimum dopant concentration in the first collector region is higher than a minimum dopant concentration in the second collector region.

13. A method for manufacturing an integrated circuit on a semiconductor chip, the method comprising:
    providing a first bipolar transistor having a first collector region of a first conductivity type; and
    providing a second bipolar transistor with a second collector region having the first conductivity type;
    growing the first collector region and the second collector region by at least one collector epitaxy;
    introducing an etch stop in the first collector region; and
    shortening the first collector region by an etching,
    wherein a collector epitaxy has a lateral solid-phase epitaxy, wherein amorphous silicon is applied on a silicide layer and on a monocrystalline silicon substrate and is crystallized in an annealing step starting from the monocrystalline silicon substrate acting as a crystallization nucleus.

14. The method according to claim 1, wherein the first collector region is shortened by the partial etching of the first collector region to the etch stop.

15. The method according to claim 1, wherein the etch stop is introduced into the first collector region during the epitaxy growth of the first collector region.

16. The method according to claim 1, wherein the etch stop is formed of a semiconductor material that is different than a semiconductor material forming the first collector region.

17. The method according to claim 1, wherein the semiconductor material of the etch stop is silicon-germanium and the semiconductor material of the first collector region is silicon.

* * * * *